(12) United States Patent
Ibok

(10) Patent No.: US 6,207,542 B1
(45) Date of Patent: Mar. 27, 2001

(54) METHOD FOR ESTABLISHING ULTRA-THIN GATE INSULATOR USING OXIDIZED NITRIDE FILM

(75) Inventor: Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/478,962

(22) Filed: Jan. 7, 2000

Related U.S. Application Data

(60) Provisional application No. 60/169,452, filed on Dec. 7, 1999.

(51) Int. Cl.[7] ................................. H01L 21/3205
(52) U.S. Cl. ..................... 438/585; 438/514; 438/791; 438/586; 156/3; 257/69
(58) Field of Search ..................... 438/585, 791; 156/3; 257/69

(56) References Cited

U.S. PATENT DOCUMENTS

| | | | |
|---|---|---|---|
| 3,997,381 | * 12/1976 | Wanlass | 156/3 |
| 5,430,328 | * 7/1995 | Hsue | 257/750 |
| 5,536,951 | * 7/1996 | Xiang et al. | 438/791 |
| 5,643,823 | * 7/1997 | Ho et al. | 437/67 |
| 5,716,871 | * 2/1998 | Yamazaki et al. | 437/195 |
| 5,926,728 | * 7/1999 | Lee et al. | 438/586 |
| 5,998,284 | * 12/1999 | Azuma | 438/514 |

* cited by examiner

Primary Examiner—Richard Booth
Assistant Examiner—Olivia Luk
(74) Attorney, Agent, or Firm—Lariviere, Grubman & Payne, LLP

(57) ABSTRACT

A method for fabricating a semiconductor device including a silicon substrate includes forming a thin Nitrogen Oxide base film on a substrate, and then depositing an ultra-thin nitride film on the base film. The semiconductor device is then annealed in situ in ammonia, following which the device is oxidized in Nitrogen Oxide. FET gates are then conventionally formed over the gate insulator, and the gates are next implanted with Nitrogen to passivate dangling Nitrogen and Silicon bonds in the nitride, thus decreasing the charge content in the film. Consequently, the resultant gate insulator is electrically insulative without degrading performance with respect to a conventional gate oxide insulator.

8 Claims, 2 Drawing Sheets

METHOD FOR ESTABLISHING ULTRA-THIN GATE INSULATOR USING OXIDIZED NITRIDE FILM

RELATED APPLICATION

This application is related to co-pending Provisional Patent Application Ser. No. 60/169,452, entitled:"METHOD FOR ESTABLISHING ULTRA-THIN GATE INSULATOR USING OXIDIZED NITRIDE FILM", filed Dec. 7, 1999, by the same applicant.

TECHNICAL FIELD

The present invention relates to the fabrication of semiconductor devices, and more particularly to establishing field effect transistor (FET) gate insulators.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

It can readily be appreciated that it is important to electrically isolate various components of an integrated circuit from each other, to ensure proper circuit operation. As one example, in a transistor, a gate is formed on a semiconductor substrate, with the gate being insulated from the substrate by a very thin dielectric layer, referred to as the "gate oxide" or "gate insulator". As the scale of semiconductor devices decreases, the thickness of the gate insulator layer likewise decreases.

As recognized herein, at very small scales, the gate insulator can be become so thin that otherwise relatively small encroachments into the gate insulator layer by sub-oxides from the substrate and from adjacent polysilicon connector electrodes can reduce the insulating ability of the gate insulator layer. This poses severe problems because under these circumstances, even very minor defects in the substrate can create electron leakage paths through the gate insulator, leading to catastrophic failure of the transistor.

To circumvent this problem, alternatives to traditional gate oxide materials, such as high-k dielectric materials including nitrides and oxynitrides that can be made very thin and still retain good insulating properties, have been proposed. Unfortunately, it is thought that these materials can degrade the performance of the transistor. Nitride, in particular, has been considered undesirable because it promotes unwanted leakage of electrons through the gate insulator layer.

Furthermore, as the gate insulator layer becomes very thin, e.g., on the order of nineteen Angstroms (19 Å), device integration becomes highly complicated. Specifically, it is necessary to etch portions of the polysilicon electrodes down to the substrate, but stopping the etch on a very thin, e.g., 19 Å gate insulator layer without pitting the substrate underneath becomes problematic. Accordingly, the present invention recognizes that it is desirable to provide a gate insulator layer that can be made very thin as appropriate for very small-scale transistors while retaining sufficient electrical insulation properties to adequately function as a gate insulator, and while retaining sufficient physical thickness to facilitate device integration, without degrading performance vis-a-vis oxide insulators.

BRIEF SUMMARY OF THE INVENTION

A method for making a semiconductor device includes providing a semiconductor substrate, and establishing a nitride film over the substrate. The method also includes annealing the substrate with film in ammonia, after which the substrate with film is oxidized in Nitrogen Oxide. Next, FET gates are formed on portions of the film.

Preferably, a Nitrogen Oxide base film is established on the substrate in contact therewith, prior to establishing the nitride film, with the nitride film being subsequently deposited on the base film. In one preferred embodiment, the base film defines a thickness of no more than fifteen Angstroms (15 Å), and more preferably the base film defines a thickness of no more than twelve Angstroms (12 Å). To alleviate degraded electron mobility, Nitrogen is implanted into at least some of the gates.

In accordance with the preferred method, the annealing act is undertaken such that the Nitrogen concentration in the nitride film is greater than the stoichiometric concentration of Nitrogen in the nitride film. Moreover, the annealing act is undertaken such that dangling Nitrogen and Silicon bonds in the nitride film are passivated to thereby decrease the charge concentration in the nitride film to a charge concentration of a thermal oxide film having the same dimensions as the nitride film. In a particularly preferred embodiment, the annealing act is undertaken at temperatures up to eleven hundred degrees Celsius (1100° C.).

Other features of the present invention are disclosed or apparent in the section entitled "DETAILED DESCRIPTION OF THE INVENTION".

BRIEF DESCRIPTION OF DRAWINGS

For understanding of the present invention, reference is made to the accompanying drawing in the following DETAILED DESCRIPTION OF THE INVENTION. In the drawings.

DETAILED DESCRIPTION OF THE INVENTION

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

Figure 1:
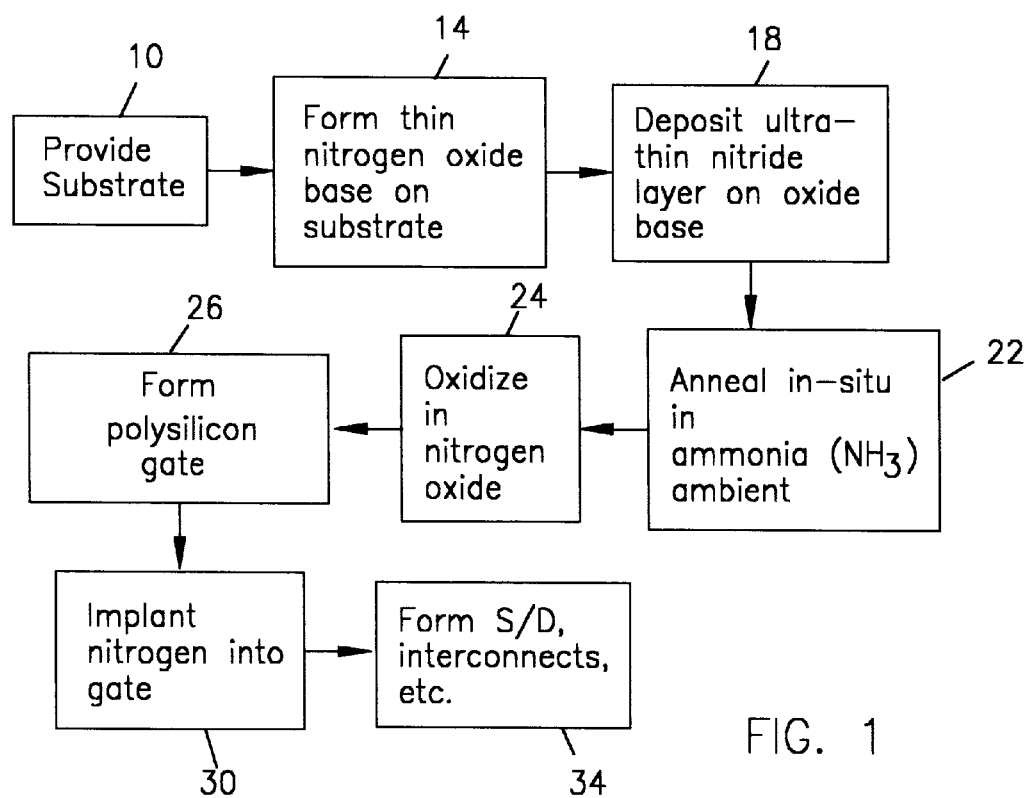
FIG. 1 is a flow chart of the manufacturing process.
Figure 2:
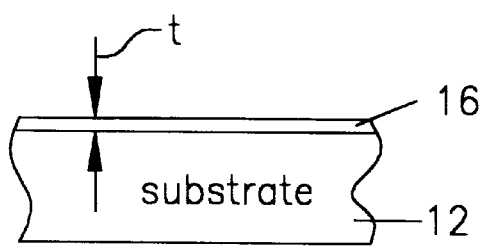
FIG. 2 is a side view of the device after forming the base film on the substrate.

Referring initially to FIGS. 1 and 2, at block 10 in FIG. 1 a semiconductor substrate 12 (FIG. 2) such as Silicon is provided, and then at block 14 a thin Nitrogen Oxide base film 16 is formed on the substrate 12 in accordance with oxide film formation principles known in the art, in direct contact with the substrate 12. The thickness "t" of the base film 16 is no more than fifteen Angstroms (15 Å), and more preferably is no more than twelve Angstroms (12 Å). In some processes a thin oxide layer about eight Angstroms thick might remain after conventional pre-gate cleaning of the substrate 12, in which case a thin Nitrogen Oxide film would not be deposited, with the thin oxide remainder film establishing the base film of the present invention.

Figure 3:
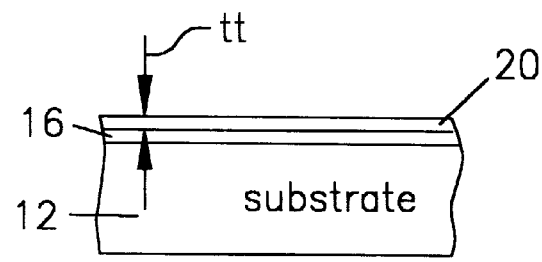
FIG. 3 is a side view of the device after forming the nitride film on the base film.

Moving to block 18 of FIG. 1 and referring to FIG. 3, an ultra-thin Nitride film 20 is deposited directly onto the base film 16 by, e.g., low pressure chemical vapor deposition (LPCVD) or other appropriate vapor deposition process. The ultrathin Nitride film 20 has a thickness "tt" of between eight Angstroms and fifteen Angstroms (8 Å–15 Å). Together, the films 16, 20 establish a gate insulator.

Proceeding to block 22 in FIG. 2, the substrate 12 with films 16, 20 is annealed in situ in ammonia ($NH_3$) at a temperature of up to eleven hundred degrees Celsius (1100° C.) to raise the Nitrogen concentration in the nitride film 20 above the stoichiometric concentration of Nitrogen in the nitride film. As recognized herein, the anneal passivates the Nitrogen and Silicon free chemical bonds ("dangling bonds") in the nitride film 20, thereby decreasing the charge concentration of the nitride film 20 to the concentration that an oxide film of the same dimensions otherwise would have, such that the performance of the nitride film 20 as an insulator is not degraded vis-a-vis oxide films.

To alleviate the undesirable decrease in electron mobility exhibited by previous nitride-like gate insulators, the process continues to block 24 in FIG. 2, wherein the substrate with film is oxidized in Nitrogen Oxide or Oxygen. The oxidation preferably is undertaken at a temperature of 700° C. to 1100° C. for about one minute or longer.

The process moves from block 24 to block 26, wherein a polysilicon-based field effect transistor (FET) stack 28 (FIG. 4) is formed on the nitride film 20 in accordance with FET gate stack deposition and patterning principles known in the art.

Figure 4:
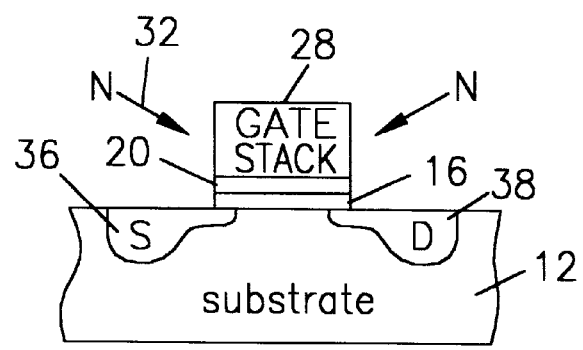
FIG. 4 is a side view of the device after forming the FET gate stacks on the nitride film.

After forming and patterning the FET stacks 28, the process moves to block 30 to implant Nitrogen into the gate stacks 28 by directing beams of Nitrogen into the stacks 28, as indicated by the arrows 32 in FIG. 4. In a preferred embodiment, the Nitrogen is implanted into the gate stacks 32 to a depth of 200 Angstroms to 2000 Angstroms.

As understood by the present invention, the effect of the Nitrogen that is implanted into the stacks 28 is to further alleviate the undesirable decrease in electron mobility exhibited by previous nitride-like gate insulators. Indeed, in implementing the above process, the present invention has discovered that, as an example, while the total thickness of the gate insulator is 24 Å, which is sufficiently physically thick to facilitate the above-mentioned device integration, the equivalent oxide electrical thickness is 20 Å, which is sufficient to adequately insulate the gate stacks 28, and electron mobility is not significantly degraded.

The process is completed at block 34, wherein FET sources and drains 36, 38 are conventionally formed, and contacts, interconnects, and FET to FET insulation are likewise conventionally undertaken.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the use of: alternate layer deposition or forming methodologies; etching technologies; masking methods; lithographic methods, passivation and nitridization techniques; as well as alternative semiconductor designs, as well as the application of the technology disclosed herein to alternate electronic components are all contemplated by the principles of the present invention. The invention disclosed herein may be practiced without any element which is not specifically disclosed herein. The use of the singular in the claims does not mean "only one", but rather "one or more", unless otherwise stated in the claims.

What is claimed is:

1. A method for making a semiconductor device, comprising:

providing a semiconductor substrate;

establishing a nitride film over the substrate;

annealing the substrate with film in ammonia; then oxidizing the substrate with film in Nitrogen Oxide; and forming FET gates on portions of the film.

2. The method of claim 1, further comprising establishing a Nitrogen Oxide base film on the substrate in contact therewith, prior to establishing the nitride film, the nitride film being deposited on the base film in contact therewith.

3. The method of claim 1, further comprising implanting Nitrogen into at least some of the gates.

4. The method of claim 2, wherein the base film defines a thickness of no more than fifteen Angstroms (15 Å).

5. The method of claim 2, wherein the base film defines a thickness of no more than twelve Angstroms (12 Å).

6. The method of claim 1, wherein the annealing act is undertaken such that the Nitrogen concentration in the nitride film is greater than the stoichiometric concentration of Nitrogen in the nitride film.

7. The method of claim 1, wherein the annealing act is undertaken such that dangling Nitrogen and Silicon bonds in the nitride film are passivated to thereby decrease the charge concentration in the nitride film to a charge concentration of a thermal oxide film having the same dimensions as the nitride film.

8. The method of claim 1, wherein the annealing act is undertaken at temperatures up to eleven hundred degrees Celsius (1100° C.).

* * * * *

UNITED STATES PATENT AND TRADEMARK OFFICE
CERTIFICATE OF CORRECTION

PATENT NO. : 6,207,542 B1
DATED : March 27, 2001
INVENTOR(S) : Effiong Ibok

It is certified that error appears in the above-identified patent and that said Letters Patent is hereby corrected as shown below:

Column 2,
Line 59, after the word "present" delete [intention] and replace with -- invention --.

Signed and Sealed this

Sixteenth Day of October, 2001

Attest:

*Nicholas P. Godici*

*Attesting Officer*

NICHOLAS P. GODICI
*Acting Director of the United States Patent and Trademark Office*